(12) United States Patent
Kim et al.

(10) Patent No.: US 9,303,844 B2
(45) Date of Patent: Apr. 5, 2016

(54) LIGHTING DEVICE COMBINING A LENS UNIT

(71) Applicant: LG INNOTEK CO., LTD., Seoul (KR)

(72) Inventors: Chul Hong Kim, Seoul (KR); Moo Ryong Park, Seoul (KR); Kwang Ho Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 13/785,522

(22) Filed: Mar. 5, 2013

(65) Prior Publication Data

US 2013/0235585 A1  Sep. 12, 2013

(30) Foreign Application Priority Data

Mar. 8, 2012 (KR) .................. 10-2012-0023756

(51) Int. Cl.
| | |
|---|---|
| G09F 13/08 | (2006.01) |
| F21V 5/04 | (2006.01) |
| F21V 13/12 | (2006.01) |
| F21V 21/14 | (2006.01) |
| F21V 5/00 | (2015.01) |
| G09F 13/04 | (2006.01) |
| H05K 1/02 | (2006.01) |
| F21V 13/04 | (2006.01) |
| H01L 33/58 | (2010.01) |
| F21Y 101/02 | (2006.01) |
| F21Y 105/00 | (2006.01) |

(Continued)

(52) U.S. Cl.
CPC .................. *F21V 13/12* (2013.01); *F21V 5/008* (2013.01); *F21V 5/04* (2013.01); *F21V 21/14* (2013.01); *G09F 13/04* (2013.01); *H05K 1/0274* (2013.01); *F21V 13/04* (2013.01); *F21Y 2101/02* (2013.01); *F21Y 2105/001* (2013.01); *H01L 33/58* (2013.01); *H05K 1/189* (2013.01); *H05K 3/284* (2013.01); *H05K 2201/10106* (2013.01); *H05K 2201/2054* (2013.01)

(58) Field of Classification Search
CPC .................... F21V 13/02; F21V 13/12; F21V 5/002–5/005; G09F 13/04; G09F 2013/0468
See application file for complete search history.

(56) References Cited

U.S. PATENT DOCUMENTS

| | | |
|---|---|---|
| 2009/0001399 A1 | 1/2009 | Diana |
| 2009/0050908 A1 | 2/2009 | Yuan et al. |

(Continued)

FOREIGN PATENT DOCUMENTS

| | | |
|---|---|---|
| CN | 101893182 A | 11/2010 |
| JP | 2004-031064 A | 1/2004 |

(Continued)

OTHER PUBLICATIONS

European Search Report dated Dec. 18, 2013 in European Application No. 13158195.0.

(Continued)

*Primary Examiner* — Mariceli Santiago

(74) *Attorney, Agent, or Firm* — Saliwanchik, Lloyd & Eisenschenk

(57) ABSTRACT

Provided is a lighting device, including: a lens unit including one or more lenses; and a light source unit which converts light emitted from a light emitting unit to surface light source and supplies the light to the lens unit, wherein the light source unit is integrally connected to the lens unit, whereby an entire thickness and volume of the product can be reduced and the lighting device can be applied to the fields of various illumination technologies, thereby having generality.

16 Claims, 3 Drawing Sheets

(51) Int. Cl.
*H05K 1/18* (2006.01)
*H05K 3/28* (2006.01)

(56) References Cited

U.S. PATENT DOCUMENTS

| | | |
|---|---|---|
| 2009/0283779 A1 | 11/2009 | Negley et al. |
| 2010/0237377 A1 | 9/2010 | Park |
| 2011/0013381 A1* | 1/2011 | Boulais .................. 362/97.1 |
| 2011/0051411 A1* | 3/2011 | Kim et al. .................... 362/235 |

FOREIGN PATENT DOCUMENTS

| | | |
|---|---|---|
| JP | 2006-236771 A | 9/2006 |
| JP | 2008-041288 A | 2/2008 |
| JP | 2008-096890 A | 4/2008 |
| JP | 2009-162843 A | 7/2009 |
| JP | 2010-135297 A | 6/2010 |
| KR | 10-2007-0109125 A | 11/2007 |
| KR | 10-2010-0132273 A | 12/2010 |
| KR | 10-2012-0003277 A | 1/2012 |
| TW | 200910654 A | 3/2009 |
| WO | WO-2006-107546 A1 | 10/2006 |
| WO | WO 2011-056026 A2 | 5/2011 |

OTHER PUBLICATIONS

Office Action dated Aug. 18, 2014 in Chinese Application No. 201310073163.8.
Office Action dated May 13, 2015 in Chinese Application No. 201310073163.8.

* cited by examiner

LIGHTING DEVICE COMBINING A LENS UNIT

CROSS-REFERENCE TO RELATED APPLICATION

This application claims the benefit under 35 U.S.C. §119 of Korean Patent Application No 10-2012-0023756, filed Mar. 8, 2012, which is hereby incorporated by reference in its entirety.

BACKGROUND

1. Field of the Invention

The present invention relates to the technical field of a lighting device, and more specifically, to a lighting device, which reduces an entire volume and weight by integrally forming a light source unit formed using a resin layer and a lens unit.

2. Description of the Related Arts

An LED (Light Emitted Diode) device is a device which converts an electrical signal to infrared rays or light using a composition semiconductor property. Unlike a florescent lamp, since the LED device does not use harmful substances such as mercury and the like, it has a low possibility to cause environmental pollution and a long life span compared to a conventional light source. Also, it is advantageous that the LED device spends low electricity compared to the conventional light source and has excellent visibility and low brilliantness due to a high color temperature.

Accordingly, a current lighting device has been developed from a structure, in which a traditional light source such as a conventional incandescent lamp or a florescent lamp is used, to a structure, in which the aforesaid LED device is used as a light source. As one example, a lighting device using an LED device and a lens as disclosed in Korean Laid-Open Patent Publication No. 10-2010-0132273 has been suggested.

FIG. 1 schematically illustrates a structure of a conventional lighting device. The conventional lighting device includes: a light source unit 10 having a LED device; a front lens 50 which collects light irradiated form the light source unit 10 in a forward direction; an external housing 70. Furthermore, a cap 30 for protecting the front lens 50 and the light source unit 10 may be further formed. At this time, the cap 30 may perform the function of a separate lens.

The conventional lighting device is generally configured such that a reflection member is disposed in an inner side of the external housing 70 to reflect light irradiated from the LED which is a point light source. To improve light reflection efficiency, a fixed space 40 is necessarily provided in an inner part of the external housing 70.

Accordingly, the conventional lighting device requires the fixed space to improve a light reflection capability. Thus, it is problematic than an entire volume and size of the lighting device are necessarily increased, and thus it would be difficult to change a design.

PRIOR ART REFERENCE

Patent Reference

Korean Laid-Open Patent Publication No. 10-2010-0132273

BRIEF SUMMARY

The present invention has been made keeping in mind the above problems occurring in the related art. An aspect of the present invention provides a structure of a lighting device which enables an entire thickness to get thin by integrally forming a lens unit and a light source unit.

Another aspect of the present invention provides a structure of a lighting device which is configured such that a light source unit itself has flexibility so that a degree of freedom in product design can be improved and reliability can be secured.

According to an aspect of the present invention, there is provided a lighting device including: a lens unit including one or more lenses; and a light source unit which converts light emitted from a light emitting unit to a surface light source and supplies the light to the lens unit, wherein the light source unit and the lens unit are formed in a structure in which they are integrally connected to each other.

According to the present invention, it is advantageous that an entire thickness and volume of the lighting device can be reduced by integrally forming the lens unit and the light source unit, and a degree of freedom in design of the lighting device can be improved.

Also, according to the present invention, it is advantageous that the lens unit and the light source unit can be integrated regardless of a shape of the lens unit because the light source unit itself is formed to have constant flexibility.

Moreover, according to the present invention, because optical loss generated between the lens unit and the light source unit is minimized, light efficiency of the lighting device can be improved.

Furthermore, according to the present invention, because the reflection member and the reflection pattern, which can efficiently reflect the light emitted from the light emitting unit, are disposed in the light source unit, the reflectance of light and brightness can be maximized, and a uniform surface light source can be provided.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION

Figure 1:
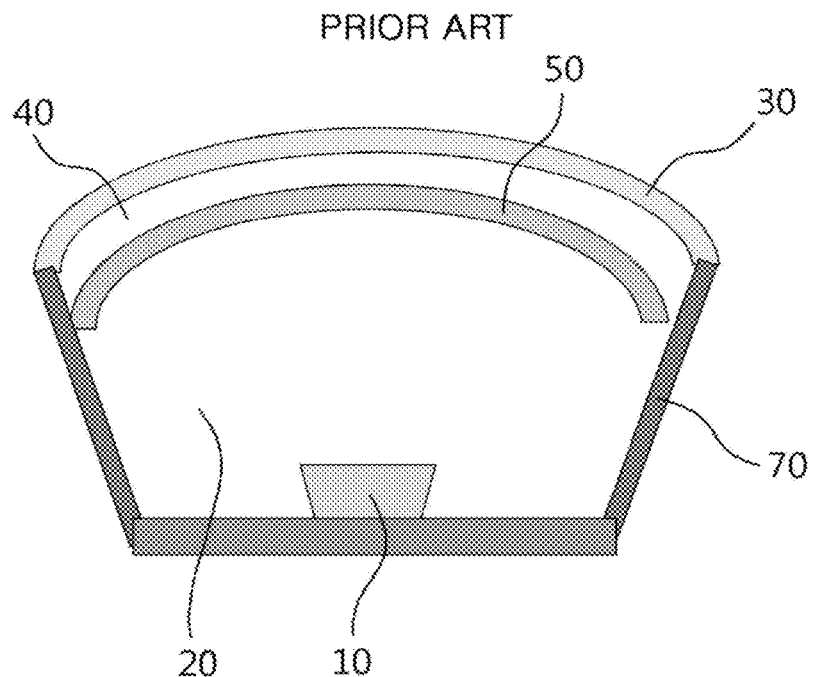
FIG. 1 schematically illustrates a structure of a conventional lighting device.

Exemplary embodiments according to the present invention will now be described more fully hereinafter with reference to the accompanying drawings so that those having ordinary skill in the art can easily embody. This invention may, however, be embodied in different forms and should not be construed as limited to the exemplary embodiments set forth herein. It is to be understood that the form of the present invention shown and described herein is to be taken as a preferred embodiment of the present invention and that various changes and modifications may be made in the invention without departing from the spirit and scope thereof. Also, in the following description, it is to be noted that, when the functions of conventional elements and the detailed description of elements related with the present invention may make the gist of the present invention unclear, a detailed description of those elements will be omitted. Reference will now be made in greater detail to a preferred embodiment of the invention, an example of which is illustrated in the accompanying drawings. Wherever possible, the same reference numerals will be used throughout the drawings and the description to refer to the same or like parts.

The gist of the present invention is to provide a structure of a lighting device, which can innovatively reduce an entire thickness by integrally forming a lens unit and a light source unit, and can also secure flexibility and improve a degree of freedom in design.

Moreover, the lighting device according to the present invention can be applied to various lamp devices such as a lamp for vehicles, a lighting device for home use, and an industrial lighting device, which require illumination. In a case where the lighting device is applied to the lamp for vehicles, it can be also applied to headlights, car indoor illumination, door scuff, backlight and the like. Additionally, the lighting device according to the present invention can be applied to the field of a backlight unit applied to a liquid crystal display device. In addition to this, the lighting device can be applied to all fields relating to illumination, which have been developed and commercialized or can be implemented according to future technical development.

Figure 2:
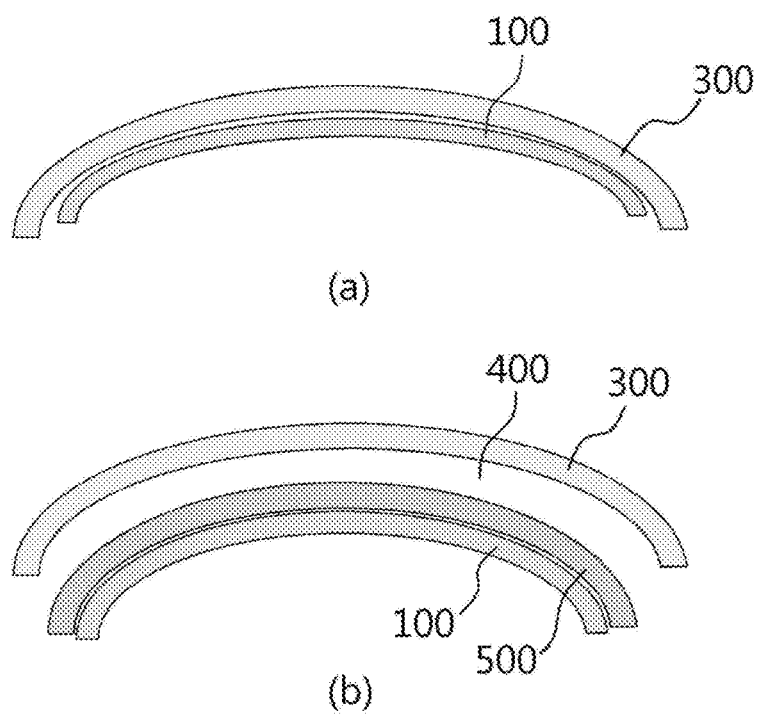
FIG. 2 illustrates a rough structure of a lighting device according to the present invention.

FIG. 2 illustrates a rough structure of a lighting device according to the present invention. More specifically, (a) of FIG. 2 illustrates the lighting device corresponding to a case in which a lens unit is composed of one lens (the outer lens), and (b) of FIG. 2 illustrates the lighting device corresponding to a case in which the lens unit is composed of two or more lens (including the outer lens and the inner lens).

Referring to (a) of FIG. 2, the lighting device of the present exemplary embodiment includes an outer lens 300 and a light source unit 100 connected to the outer lens 300.

The light source unit 100 includes a light emitting unit in an inner part thereof, converts light emitted from the light emitting unit to a surface light source and emits the light to the outer lens 300. Furthermore, the light source unit 100 is formed on an inner side of the outer lens 300. At this time, a combination of the light source unit 100 and the outer lens 300 may be realized by an adhesive material. In addition to this, the combination may be also performed in such a way that the light source unit 100 is directly adhered to the outer lens 300. Meanwhile, in particular, the light source unit 100 of the present invention is formed in a structure in which the light guide plate is removed and the resin layer is formed. More specific explanation will be described in the explanation of FIG. 3 to FIG. 6.

The outer lens 300 concentrates light emitted from the light source unit 100 and converts the light to parallel light. The outer lens 300 may simultaneously perform the function of a cap for protecting inner configurations of the lighting device. All materials having light transmission may be used as a material of the outer lens 300 without a limitation. For example, the outer lens 300 may be formed of a glass material, a PC (polycarbonate) material, a PMMA (poly(methyl methacrylate)) material, other polymer resins and the like.

Referring to (b) of FIG. 2, in the lighting device according the present exemplary embodiment of the invention, the lens unit is composed of the outer lens 300 and an inner lens 500. Furthermore, the light source unit 100 is formed in a structure in which it is connected to the inner lens 500, and more specifically, a structure in which it is connected to an inner side of the inner lens 500. At this time, the combination of the light source unit 100 and the inner lens 500 may be realized by an adhesive material. In addition to this, the combination may be also realized in such a way that the light source unit is directly adhered to the inner lens 500. The explanation regarding a material for forming the inner lens 500 except for the above explanation is identical with as that of the outer lens 300. Thus, the explanation thereon is omitted.

In the case of the lighting device according to the present exemplary embodiment of the invention, by appropriately adjusting and changing the inner lens 500 and the outer lens 300, the light emitted to the outside may be converted to diffusion light, parallel light and the like. For example, when the light is emitted from the light source unit, the inner lens 500 primarily concentrates the light and converts it to parallel light. The outer lens 300 secondarily concentrates the light emitted from the inner lens 500 and converts it to more accurate parallel light, thereby emitting the light to the outside.

Meanwhile, a lens air gap 400 may be further formed between the inner lens 500 and the outer lens 300 so that the light passing through the inner lens 500 is uniformly diffused and is thus supplied to the outer lens 300. That is, thanks to the formation of the lens air gap 400, uniformity of the light supplied to the outer lens 300 can be improved. As a result, the uniformity of the light diffused and emitted through the outer lens 300 can be improved.

According to the lighting device of the present invention having the aforesaid structure, because the lens unit and the light source unit are integrated, an entire thickness and volume of the lighting device can be reduced. Furthermore, as the thickness and volume are reduced, a degree of freedom in design of the lighting device can be improved and the lighting device can be applied to various fields relating to illumination. Moreover, as the lens unit and the light source unit are formed to be closely adhered to each other, light loss generated between the lens unit and the light source unit may be minimized, thereby improving light efficiency of the lighting device.

Figure 3:
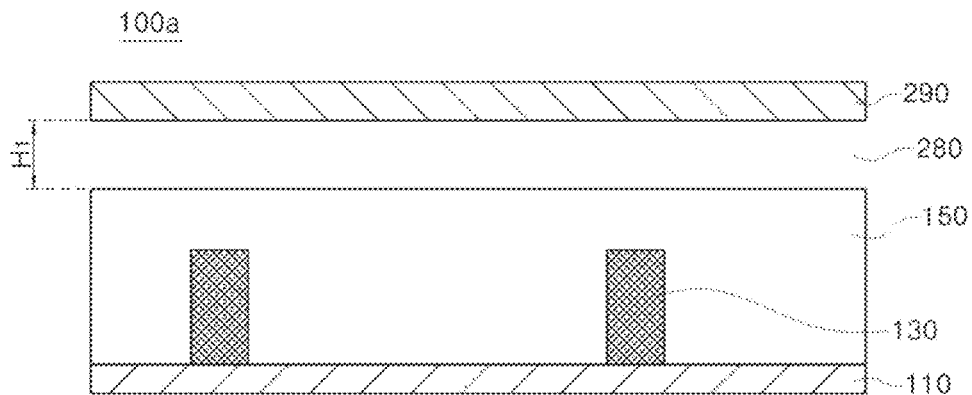
FIG. 3 illustrates a main structure of a light source unit of the lighting device illustrated in FIG. 2.

FIG. 3 illustrates a main structure of a light source unit of the lighting device illustrated in FIG. 2.

Referring to FIG. 3, a light source unit 100a of the present invention may be include: a printed circuit board 110; one or more light emitting units 130 formed on the printed circuit board 110; the resin layer 150 which is formed on the light emitting unit 130 so that the light emitting unit 130 is embedded therein, and guides emitted light forward. Furthermore, it may further include a diffusion plate 290 which uniformly diffuses light incident from the resin layer and emits the light to the outside. Also, a prism sheet and a protective sheet may be further provided into an upper part or a lower part of the diffusion plate 290, even though this is not illustrated.

The printed circuit board 110 means a board in which a circuit pattern is formed on the board, namely, a PCB. In particular, to secure constant flexibility, the printed circuit board according to the present invention may be formed as a flexible printed circuit board (FPCB).

The light emitting units 130 are configured such that one or more light emitting units are arranged on the printed circuit board 110 so that light is emitted. The light emitting units 130 of the present invention may be composed of side view type light emitting diodes. That is, light emitting diodes having a structure in which the emitted light is emitted in a lateral direction rather than going straight up may be used as the light emitting units 130 of the present invention. Thus, the light source unit 100a is configured such that the light emitting units 130 composed of the side view type light emitting diodes are disposed in a direct type. Furthermore, the resin layer which functions to diffuse and reflect light is utilized so that the light is diffused and guided in a direction of the diffusion plate 290, thereby reducing the total number of light emitting units and innovatively reducing an entire weight and thickness of the lighting device.

The resin layer 150 is formed in an upper part of the light emitting units 130 and the printed circuit board 110. The resin layer 150 diffuses and guides the light emitted from the light emitting units 130 forward. That is, because the resin layer 150 is formed in a structure in which the light emitting units 130 are embedded in the resin layer, the resin layer 150 functions to diffuse the light emitted from the light emitting units in a lateral direction. That is, the resin layer 150 may perform the function of a conventional light guide plate.

The resin layer 150 of the present invention may be basically composed of the resin of a material which can diffuse light. For example, the resin layer may be composed of an ultraviolet curing resin including an oligomer. More specifically, the resin layer 150 may be formed using the resin which has a urethane acrylate oligomer as a main raw material. For example, the resin in which the urethane acrylate oligomer which is a synthetic oligomer is mixed with a polymer type which is polyacryl may be used. Of course, in addition to this, a monomer, in which IBOA (isobornyl acrylate), HPA (Hydroxyl propyl acrylate), 2-HEA (2-hydroxyethyl acrylate), which are low boiling point and diluted type reactive monomers, are mixed, may be further included. A photo initiator (e.g. 1-hydroxycyclohexyl phenyl-ketone and the like) or an antioxidant and the like may be mixed as an additive. However, this is only one example. In addition to these materials, all resins capable of performing the light diffusion function, which have been developed and commercialized or can be implemented according to future technical development, may be used for the resin layer 150.

According to the present invention, thanks to the existence of the resin layer 150, the thickness occupied by the conventional light guide plate can be innovatively reduced, and the entire product can be made thinner. Also, because the lighting device has flexibility, it is advantageous that the light device may be easily applied to a curved surface such as the lens unit, and a degree of freedom in product design may be improved. Furthermore, it is advantageous that the lighting device may be applied to other flexible display devices.

The diffusion plate 290 is formed in an upper part of the resin layer 150 and functions to uniformly diffuse light emitted through the resin layer 150 all over the surface. The diffusion plate 290 may be generally formed of acryl resin. However, the material is not limited. In addition to the acryl resin, the diffusion plate 290 may be formed of all materials of high transmission plastic such as poly-styrene (PS), poly (methyl methacrylate) (PMMA), cyclic olefin copolymers (COC), polyethylene terephthalate (PET), resin, which can perform the light diffusion function An air layer (a first air gap 280) may be further formed between the diffusion plate 290 and the resin layer 150. At this time, thanks to the existence of the first air gap 280, the uniformity of light supplied to the diffusion plate 290 may be increased. As a result, the uniformity of light diffused and emitted through the diffusion plate 290 may be improved, and uniform surface light emitting may be realized. Meanwhile, to minimize the deviation of light which transmits the resin layer 150, a thickness (H1) of the first air gap 280 may be formed in a range of exceeding 0 but not exceeding 20 mm. However, the thickness is not limited to this. The thickness may be appropriately designed and changed as necessary.

Figure 4:
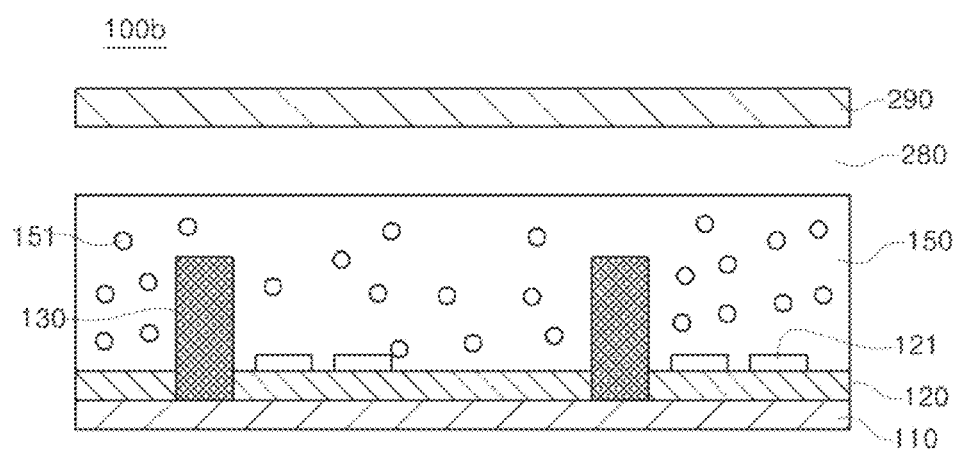
FIG. 4 illustrates a structure in which beads and a reflection member are added to the light source unit illustrated in FIG. 3.

FIG. 4 illustrates a structure 100b in which beads and a reflection member are added to the light source unit as illustrated in FIG. 3.

Referring to FIG. 3 and FIG. 4, the resin layer 150 according to the present invention may further include a plurality of beads 151, which have a hollow (or an air-void) formed in an inner part thereof, in a mixed and diffused shape. The beads 151 function to improve light reflection and diffusion properties. For example, when the light emitted from the light source unit 130 is incident to the beads 151 of the inner part of the resin layer 150, the light is reflected and transmitted due to the hollow of the beads 151, and then the light is diffused and concentrated, thereby being emitted to the diffusion plate 290. At this time, because the reflectance and diffusivity of light increase due to the beads 151, an amount and uniformity of the emitted light supplied to the diffusion plate 290 later are improved, thereby improving brightness of the lighting device.

A content of the beads 151 may be appropriately adjusted to obtain a desired light diffusion effect. More specifically, the content of the beads may be adjusted in a range of 0.01 to 0.3% based on a total weight of the resin layer 150. However, the content is not limited to this. That is, the light emitted from the light emitting units 130 in the lateral direction is diffused and reflected through the resin layer 150 and the beads 151 so as to travel in an upper direction. The beads 151 may be formed of any one selected from silicon, silica, glass bubble, PMMA, urethane, Zn, Zr, $Al_2O_3$ and acryl. A diameter of the beads 151 may be formed in a range of 1 μm~20 μm. However, the diameter is not limited to this.

A reflection member 120 of the present invention is formed on an upper surface of the printed circuit board 110 and has a structure in which the light emitting units 130 are formed to pass through the reflection member. The reflection member 120 according to the present invention is formed of a material having high reflection efficiency, thereby enabling light loss to be reduced. The reflection member 120 may be formed in a film shape and may include a synthetic resin in which a white pigment is diffused and contained so that light reflection and diffusion properties can be implemented. For example, titanium oxide, aluminum oxide, zinc oxide, lead carbonate, barium sulfate, calcium carbonate and the like may be used as the white pigment. Polyethylene terephthalate, polyethylene naphtaenate, acryl resin, poly carbonate, polystyrene, polyolefin, cellulose acetate, weather resistant vinyl chloride and the like may be used as the synthetic resin. However, the present invention is not limited to this.

A reflection pattern 121 may be formed on a surface of the reflection member 120. The reflection pattern 121 functions to uniformly transmit light to the diffusion plate 290 by scattering and diffusing the incident light. The reflection pattern 121 may be formed by printing the surface of the reflection member 120 using a reflection ink including any one of $TiO_2$, $CaCO_3$, $BaSO_4$, $Al_2O_3$, Silicon and PS. However, the present invention is not limited to this.

Figure 5:
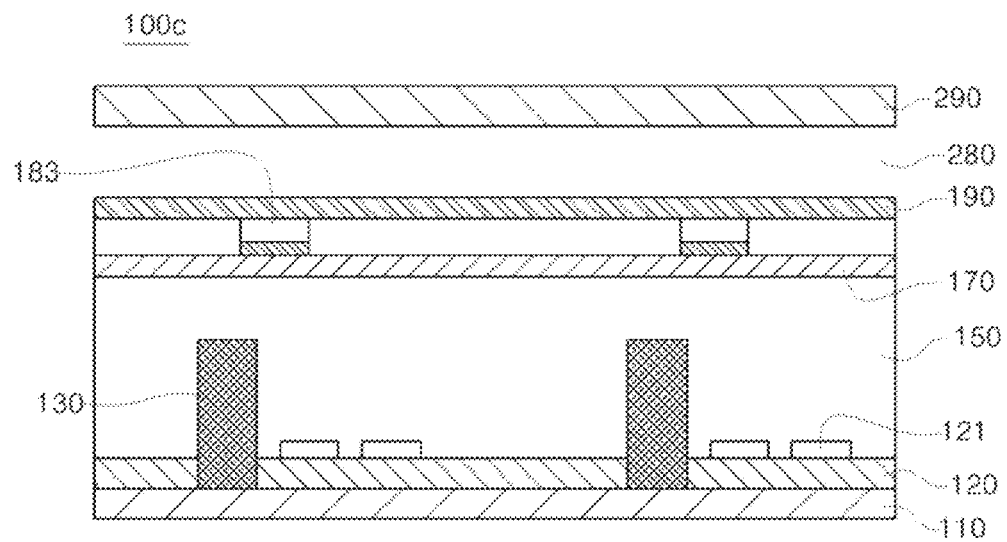
FIG. 5 illustrates a structure in which the reflection member and an optical sheet are added to the light source unit illustrated in FIG. 3.

FIG. 5 illustrates a structure 100c in which the reflection member and an optical sheet are added to the light source unit as illustrated in FIG. 3.

Hereinafter, it will be explained that the reflection member and the optical sheet are added to the structure as illustrated in FIG. 3. However, this is only one example. The optical sheet may be added to the light source unit as illustrated in FIG. 4 showing the structure in which the beads and the reflection member are added thereto.

Referring to FIG. 3 to FIG. 5, the light source unit 100c of the present invention may further include: a first optical sheet 170 formed on an upper surface of the resin layer 150; and a second optical sheet 190 formed on the first optical sheet 170. Also, an optical pattern 183 may be further formed on an upper surface of the first optical sheet 170 or a lower surface of the second optical sheet 190. One or more optical sheets may be additionally formed on the second optical sheet 190.

The optical pattern 183 formed on the upper surface of the first optical sheet 170 or the lower surface of the second optical sheet 190 may be formed as a light shielding pattern which is formed to inhibit the concentration of light emitted from the light emitting units 130. For this, it is required to align between the optical pattern 183 and the light emitting units 130. At this time, to secure constant strength after performing the aligning, the first optical sheet 170 and the second optical sheet 190 are adhered to each other using an adhesive layer which will be hereinafter explained.

The first optical sheet 170 and the second optical sheet 190 may be formed using a material having excellent light transmission. As one example, PET may be used.

The optical pattern 183 disposed between the first optical sheet 170 and the second optical sheet 190 functions so as not to concentrate the light emitted from the light emitting units 130. The optical pattern 153 may be formed as a light shielding pattern so that a light shielding effect can be realized in a predetermined part to inhibit a phenomenon in which an optical property is deteriorated or yellowish light is generated due to excessive strong light strength. The light shielding pattern may be formed by performing a printing process to the upper surface of the first optical sheet 170 and the lower surface of the second optical sheet 190 using a light shielding ink.

The optical pattern 183 may be realized as one optical pattern so as to perform the function to partially shield and diffuse light rather than the function to completely shield the light, thereby adjusting a light shielding and diffusing degree. Furthermore, more specifically, the optical pattern 183 according to the present invention may be realized in an overlapping print structure of composite patterns. The overlapping print structure means a structure which is implemented by forming one pattern and printing another pattern shape on an upper part thereof.

As one example, the optical pattern 183 may be implemented in a structure in which the diffusion pattern formed on a lower surface of a polymer film in a light emitting direction using a light shielding ink including one or more materials selected from $TiO_2$, $CaCO_3$, $BaSO_4$, $Al_2O_3$ and Silicon overlaps with the light shielding pattern formed using a light shielding ink including Al or a mixture of Al and $TiO_2$. That is, the diffusion pattern is formed on the surface of the polymer film by performing a white printing process, and thereafter, the light shield pattern is formed thereon. In reverse, the patterns may be formed in a double structure. Of course, it would be obvious that the formation design of the patterns may be variously changed in consideration of the efficiency and strength of light and a shading ratio. Also, the patterns may be formed in such a tripe structure that in a sequential laminated structure, the light shielding pattern which is a metal pattern is formed in a middle layer, and diffusion patterns are implemented in an upper part and a lower part thereof. In this triple structure, the patterns may be implemented by selecting the aforesaid materials. As one preferred example, based on the triple structure in which one diffusion pattern of diffusion patterns is implemented using $TiO_2$ having excellent reflectance, another diffusion pattern is implemented using $CaCO_3$ and $TiO_2$ together having excellent safety and color sense, and the light shielding pattern is implemented using Al having excellent hiding power, the efficiency and uniformity of light can be secured. In particular, $CaCO_3$ functions to decrease the exposure of yellowish light, and thus functions to finally implement white light, so the more stable efficiency of light can be realized. In addition to $CaCO_3$, inorganic materials having a large particle size and a similar structure such as $BaSO_4$, $Al_2O_3$ and Silicon beads and the like may be utilized. Moreover, in view of the efficiency of light, it would be preferable that the optical pattern 183 is formed by adjusting a pattern density in such a manner that the pattern density is reduced as the optical pattern is moved far from the light emitting direction of the LED light source.

Figure 6:
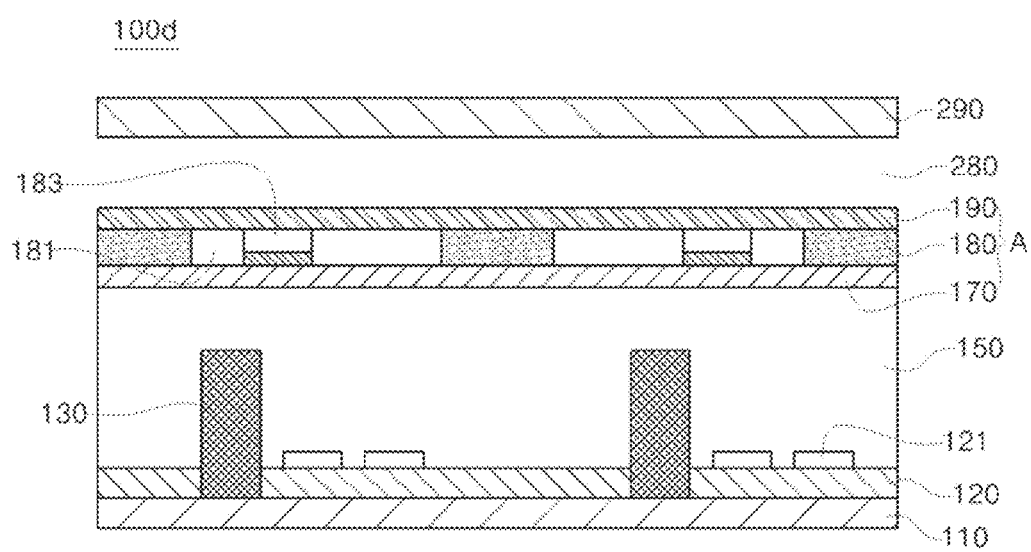
FIG. 6 illustrates a structure in which an adhesive layer is formed in the lighting device of the present invention illustrated in FIG. 5.

FIG. 6 illustrates a structure 100d in which an adhesive layer is funned in the lighting device of the present invention illustrated in FIG. 5.

Referring to FIG. 3 to FIG. 6, a light source unit 100d of the present invention may further include an adhesive layer 180 formed between the first optical sheet 170 and the second optical sheet 190. A second air gap 181 may be further formed in the adhesive layer 180. That is, the adhesive layer 180 may form a spaced space (a second air gap 181) around the optical pattern 183, and may be implemented in a structure in which the first optical sheet 170 and the second optical sheet 190 are adhered to each other by applying an adhesive material to remaining parts except for the space. Also, one or more optical sheets may be additionally formed on the second optical sheet 190. The structure including the first optical sheet 170, the second optical sheet 190, the adhesive layer 180 and the optical pattern 183 may be defined as an optical pattern layer A.

The adhesive layer 180 may be formed in a structure in which the adhesive layer 180 surrounds around the optical pattern 183 and forms the second air gap 181 in the remaining parts or a structure in which the adhesive layer forms the second air gap 181 around the optical pattern 183. Thus, aligning may be realized by bonding two optical sheets to each other. That is, the bonding structure of the first optical sheet 170 and the second optical sheet 190 may function to fix the printed optical pattern 183.

At this time, the adhesive layer 180 may be formed using a thermosetting PSA, a thermosetting adhesive, UV curing PSA type materials. However, the present invention is not limited to this.

At this time, the first air gap 280 as described in the explanation of FIG. 3 may be formed between the second optical sheet 190 and the diffusion plate 170. Thanks to the existence of the first air gap 280, the uniformity of light supplied to the diffusion plate 290 can increase, thereby improving the uniformity of light diffused and emitted through the diffusion plate 290. At this time, to minimize the deviation of light which transmits the resin layer 250, a thickness of the first air gap 280 may be formed in a range of exceeding 0 but not exceeding 20 mm. However, the thickness is not limited. As described in the explanation of FIG. 3, the thickness may be appropriately designed and changed as necessary.

Also, as described above, one or more optical sheets may be additionally formed on the optical pattern layer A as necessary, even though this is not illustrated.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A lighting device, comprising:
a lens unit including one or more lenses; and
a light source unit which converts light emitted from light emitting units to a surface light source and supplies the light to the lens unit;
wherein the light source unit is connected to the lens;
wherein the light source unit is flexible and is curved along a curved surface of the lens unit facing the light source unit;
wherein the light source unit comprises a printed circuit board, one or more light emitting units formed on the printed circuit board, a resin layer that is formed on the printed circuit board and in which the light emitting units are embedded, and a diffusion plate formed on an upper side of the resin layer;
wherein a first air gap is formed between the resin layer and the diffusion plate; and
wherein the lens unit comprises an inner lens and an outer lens formed on the inner lens, and the light source unit is connected to a lower surface of the inner lens.

2. The lighting device of claim 1, wherein the lens unit comprises an outer lens, and the light source unit is connected to a lower surface of the outer lens.

3. The lighting device of claim 1, wherein the light source unit further comprises a reflection member which is formed between the printed circuit board and the resin layer, and has a structure in which the light emitting units pass through the reflection member.

4. The lighting device of claim 3, wherein a reflection pattern is formed on the reflection member.

5. The lighting device of claim 4, wherein the reflection pattern is formed with a reflective ink including any one of $TiO_2$, CaCO3, BaSO4, $Al_2O_3$, Silicon and PS.

6. The lighting device of claim 1, wherein the light emitting units are composed of side view type light emitting diodes.

7. The lighting device of claim 1, wherein the first air gap is formed in a range of exceeding 0 but not exceeding 20 mm.

8. The lighting device of claim 1, wherein the light source unit further comprises a first optical sheet which is formed on the upper surface of the resin layer and diffuses emitted light.

9. The lighting device of claim 8, wherein the light source unit further comprises a second optical sheet formed on the first optical sheet.

10. The lighting device of claim 9, wherein an optical pattern for shielding or reflecting emitted light is formed on an upper surface of the first optical sheet or a lower surface of the second optical sheet.

11. The lighting device of claim 10, wherein the optical pattern is formed in a structure in which a diffusion pattern formed using a light shielding ink including one or more materials selected from $TiO_2$, $CaCO_3$, $BaSO_4$, $Al_2O_3$ and silicon overlaps with a light shielding pattern formed using a light shielding ink including Al or a mixture of Al and $TiO_2$.

12. The lighting device of claim 11, wherein the diffusion pattern is formed in a structure in which the diffusion pattern is printed on at least one of an upper surface and a lower surface of the light shielding pattern.

13. The lighting device of claim 1, wherein the resin layer is composed of a ultraviolet curing resin including a oligomer.

14. The lighting device of claim 13, wherein the oligomer includes any one material selected from urethane acrylate, epoxy acrylate, polyester acrylate and acrylic acrylate.

15. The lighting device of claim 1, wherein the resin layer further comprises beads composed of any one selected from silicon, silica, glass bubble, PMMA, urethane, Zn, Zr, $Al_2O_3$, and acryl.

16. The lighting device of claim 1, wherein the printed circuit board is composed of a flexible printed circuit board.

* * * * *